(12) United States Patent
van der Valk et al.

(10) Patent No.: US 7,078,946 B2
(45) Date of Patent: Jul. 18, 2006

(54) ANALOG PLL WITH SWITCHED CAPACITOR RESAMPLING FILTER

(75) Inventors: Robertus Laurentius van der Valk, Dordrecht (NL); Gerrit Dijkstra, Rotterdam (NL); Philip Ching, Ontario (CA)

(73) Assignee: Zarlink Semiconductor Inc., Kanata (CA)

( * ) Notice: Subject to any disclaimer, the term of this patent is extended or adjusted under 35 U.S.C. 154(b) by 246 days.

(21) Appl. No.: 10/330,836

(22) Filed: Dec. 27, 2002

(65) Prior Publication Data

US 2003/0155950 A1 Aug. 21, 2003

(30) Foreign Application Priority Data

Jan. 11, 2002 (GB) .............................................. 0200562

(51) Int. Cl.
*H03L 7/06* (2006.01)

(52) U.S. Cl. ........................................ 327/156; 327/337
(58) Field of Classification Search ................ 327/147, 327/148, 155, 156, 157, 337; 331/17, DIG. 2; 375/374–376
See application file for complete search history.

(56) References Cited

U.S. PATENT DOCUMENTS

| | | | |
|---|---|---|---|
| 4,468,798 A | 8/1984 | Riebeek | |
| 5,021,749 A | 6/1991 | Kasai et al. | |
| 6,157,242 A * | 12/2000 | Fukui | ........................ 327/536 |
| 6,222,895 B1 | 4/2001 | Larsson | |
| 6,255,872 B1 * | 7/2001 | Harada et al. | ............... 327/157 |
| 6,317,006 B1 * | 11/2001 | Welland et al. | ................ 331/25 |
| 6,369,660 B1 * | 4/2002 | Wei et al. | ...................... 331/15 |
| 6,388,506 B1 * | 5/2002 | Voo | ............................. 327/536 |
| 6,563,387 B1 | 5/2003 | Hirano et al. | |
| 6,590,459 B1 * | 7/2003 | Van Zeijl | ..................... 331/17 |

FOREIGN PATENT DOCUMENTS

| | | |
|---|---|---|
| DE | 3006632 C2 | 8/1991 |
| EP | 0 072 751 B1 | 2/1983 |
| JP | 0621644 | 10/1994 |
| WO | WO 01/26320 A1 | 4/2001 |

OTHER PUBLICATIONS

Maxim, A.; Baker S.; Schneider, E.; Hagge, M.; Chacko S., Stiurca, D.; "A Low Jitter 125–1250–MHz Process Independent and Ripple–Poleless 0.18–82 m CMOS PLL Based on a Sample–Reset Lopp Filter", IEEE Journal of Solid State Circuits, Nov. 2001; pp. 1673–1683; vol. 35, No. 11; IEEE.
Lee, Tai–Cheng; RAZAVI, Behzad; "A Stabilization Technique for Phase–Locked Frequency Synthesizers", 2001 Symposium on VLSI Circuits Digest of Technical Papers; pp. 39–42.
"Applied Ideas Your Electronic Ideas Could Reward You"; Electronic Engineering; May 1983; pp. 27–28; vol. 55, No. 677; London , Great Britain.
"Data Sheets 74HC/HCT4046A Phase–Locked–loop with VCO", Phillips Semiconductor; Nov. 25, 1997; pp. 1–34.

* cited by examiner

*Primary Examiner*—My-Trang Nu Ton
(74) *Attorney, Agent, or Firm*—Lawrence E. Laubscher, Jr.

(57) ABSTRACT

A resampler filter for use in an analog phase-locked loop has a charge pump and one or more switched capacitors switched by signals derived from a voltage controlled oscillator in the phase locked loop.

16 Claims, 13 Drawing Sheets

ANALOG PLL WITH SWITCHED CAPACITOR RESAMPLING FILTER

BACKGROUND OF THE INVENTION

1. Field of the Invention

The present invention relates to the field of phase-locked loops (PLLs), and more particularly to a resampling filter in an analog PLL. The novel filter is especially suitable for use in integrated circuit designs.

2. Description of Related Art

A filter in an analog loop for a PLL must satisfy a number of requirements. It should provide a limited impedance into which the charge pump pumps its charge. This impedance should be stable, and preferably be at a constant voltage. This makes the charge pump repeatable, which is of importance for the matching in the signal shaping. It should retime an irregular (or semi-regular) signal from the charge pump into an equidistant signal. The irregularity is created by the mistiming of the reference signal. Thus, the signal out of the charge pump is not only variable in effective magnitude, but also in phase. The timing problem creates phase modulated spectra on the charge pump output. The related Bessel functions carry the signal down to near DC. Retiming is effective in repressing this again. The filter must provide a normal low pass filter type of first order or even higher. For stability the higher orders may become active relatively late. The impedance of the VCO that is controlled by the filter should be considered infinite. The filter must be such that the loop is unconditionally stable. The rest of the loop will have one dominant pole (VCO). The filter must be low noise. It should also not introduce more errors than resolved in the rest of the system.

FIG. 1 shows a conventional traditional PLL filter with a resistor and a capacitor. Although this is generally thought of a normal low pass filter, it is in fact really a pole and a zero in series with each other.

The control on the current source is in fact the charge up/down enable signal. Thus the current out of the current source is in fact the actual charge current. FIG. 2 shows the voltage output of such a filter.

At a certain moment the charge pump starts pumping. At that moment the voltage jumps; the current will lead to a voltage across the resistor. Once the current stops this jump is made back again. The capacitor will meanwhile start charging, which is depicted in the slanting part of the line, giving a different voltage between the start and the end. In effect, the capacitor provides an integrating part in the filter, and the resistor a proportional part.

The integrated part is relatively straightforward. However, the resistor contribution is quite complex. The resistor does not affect the output of the filter once the charge pump has completed it pumping action. Thus, the effect of the resistor must come from the 'jump part' only. It is this jump voltage that makes the difference between a stable and an unstable loop. In a PLL, the contribution of the resistor after the VCO will in fact be the integral (VCO) of the area which comes from the resistor. It must be the area; both time and magnitude matter. The time defines the period over which the VCO will run extra fast (or slow). The resistor defines the actual voltage, together with the charge current. Expressed in system terms, the resistor size will make the system less or more stable, the time domain carries the linear nature of the error signal. It is however undesirable to employ resistors in integrated circuits.

SUMMARY OF THE INVENTION

According to the present invention there is provided a phase locked loop comprising a phase detector having an output; a voltage controlled oscillator having an input; a feedback loop connecting an output of said controlled oscillator to an input of said phase detector; and a resampling filter connecting the output of said phase detector to the input of said controlled oscillator, said resampling filter comprising a charge pump and one or more switched capacitors arranged in parallel and controlled by signals derived from the voltage controlled oscillator.

The switching of the capacitors can be controlled by the proportional circuit in the feedback loop of the PLL. The novel filter is particularly well suited for incorporation into integrated circuit designs.

The invention is based in part on the recognition that the most significant feature the area under the voltage curve. The novel resampler uses only switches and capacitors. While the switches are active devices, they do not operate in their linear regime, so that they do not contribute much noise.

BRIEF DESCRIPTION OF THE DRAWINGS

The invention will now be described in more detail, by way of example only, with reference to the accompanying drawings, in which;—

DETAILED DESCRIPTION OF THE PREFERRED EMBODIMENTS

Figure 1:
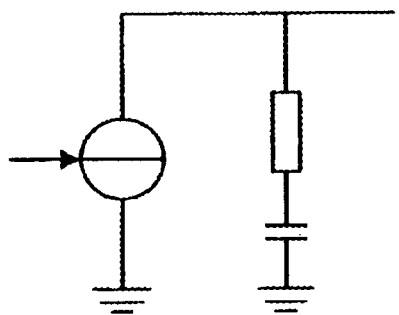
FIG. 1 is a schematic diagram of a conventional filter.
Figure 2:
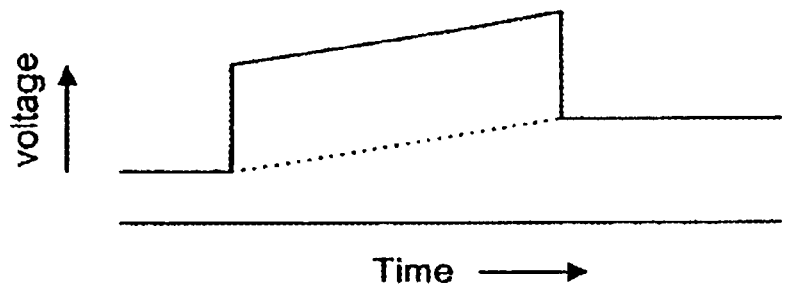
FIG. 2 is a voltage-time chart showing the behaviour of the filter in FIG. 1.
Figure 3:
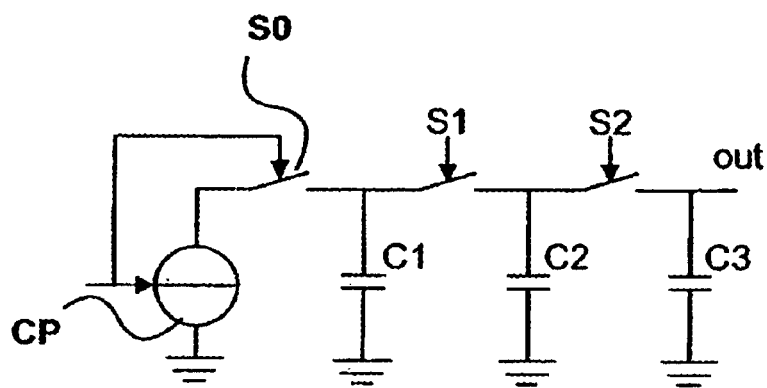
FIG. 3 is a schematic diagram of a resampler filter.

Referring now to FIG. 2, a charge pump CP charges a series of switched capacitors C1, C2, C3. The first switch S0 is in fact in the current source, and depicts the switching by the charge pump, which is also indicated by the control being shared.

All switches are executed once per reference (or feedback) cycle. In the example waveforms, these cycles have been divided into two steps, a first in which the charge pump and S2 are active, a second in which S1 is active. This reasonably demonstrates the timing that one may expect in PLLs; if a PLL multiplies its reference frequency by 2 or more it is trivial enough to generate these phases. However, when reading the figures it is important to have this in mind; each reference cycle occupies two steps in the simulations.

The effect of this switching arrangement is that the first capacitor C1 is charged by the charge pump first. In a second stage the second switch closes and shares the charge between the first and the second stage. The third switch does the same between the C2 and C3 capacitor.

It will be clear that after a while of switching some input on C1 will be spread over all capacitors C1, C2 and C3. The mechanism is in fact a series that can quite easily be developed. This spreading of the charge means that the capacitors act as one large summated capacitor for low frequencies on the input of the circuit. So the arrangement integrates perfectly, with an effective capacitance of C1+C2+C3. The charge sharing is effectively executed by the middle capacitor C2, which behaves towards the other two as a kind of resistor. By making C2 large compared to the other two, the settling goes extremely fast. If it is small the system will take a long time to settle.

The sharing in fact adds an extra pole, or better, low pass behaviour, that can be influenced by the capacitor ratios. The ratio between the middle capacitor and the others is most important. The low pass behaviour is present in a sampled fashion; for a very 'resistive' (so small) C2 the behaviour will be neatly RC like, for a very low 'resistance' (so big) C2 the step will be almost a single one.

Figure 4:
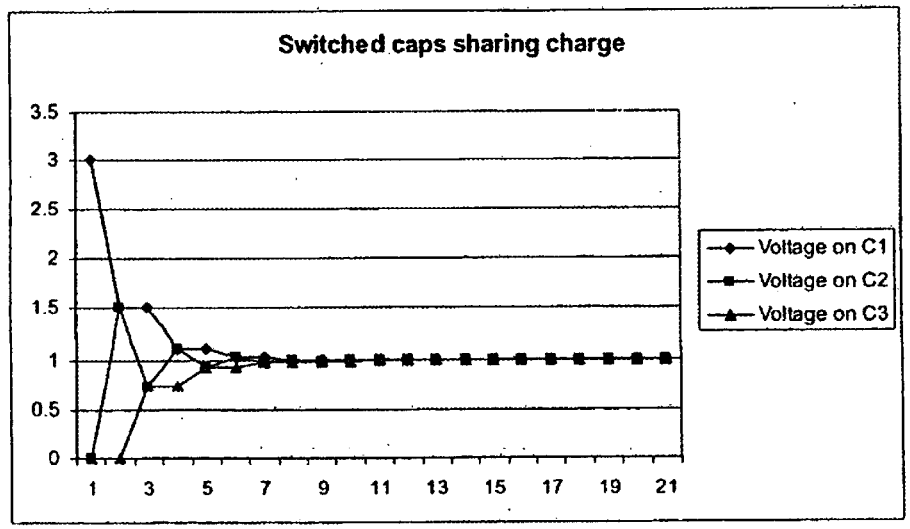
FIGS. 4 to 6 are simulations showing the sharing of charge in switched capacitors.
Figure 5:
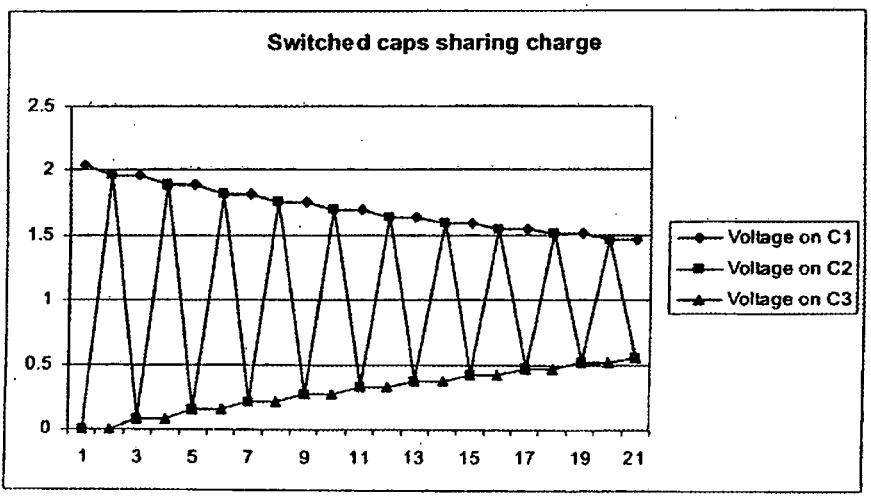
Figure 6:
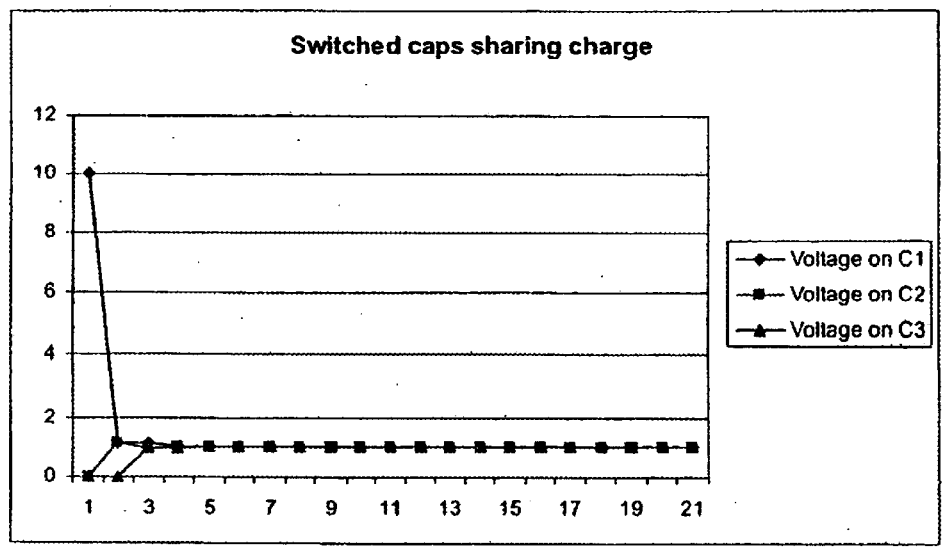

In FIGS. 4 to 6, a few typical examples of the behaviour of switched capacitors are shown. The whole cycle of the circuit is carried out in two steps. In the first step the charge pump transfers its charge into the first capacitor. In the same time period the two other capacitors share their charge. In the second step the sharing is only between the first two capacitors.

FIG. 4 shows the result with a scaled impulse input into the circuit with three equal sized capacitors, i.e. with a ratio 1:1:1.

FIG. 5 shows the result of a scaled impulse with a very small middle capacitor. The ratios used here are 49:2:49.

FIG. 6 shows the result of a scaled impulse with a very large middle capacitor. The ratios used here are 1:8:1.

It will be clear from these Figures that this switched capacitor circuit is a good configuration for the integrator of the filter; it is a perfect capacitor for low frequencies, and gives some extra attenuation for high frequencies if desired. It is not desirable to use very extreme capacitor ratios. For instance extremely small capacitive loads should not be used since then the voltage swings become extreme. The output capacitor should not become too small; otherwise the switching noise becomes dominant into the VCO. The middle capacitor may become relatively small, but then the phase margin of the loop might suffer.

From the description so far it becomes clear that the switched capacitor circuit has an integrating behaviour, and that its final integration behaviour (so near DC) will be identical to a normal current source trailed by the summation of the three capacitors. However, the precise behaviour is of course different from a single capacitor, and that difference is of importance due to stability issues and alike. For this reason the behaviour will be analyzed in the frequency domain. The analysis will first concentrate on finding the proper Z transform formula for the coherence between input and output. In the resulting formula Z can be replaced by the proper frequency domain formula, which can be plotted and studied.

The Z transform can be found by properly observing all node equations at different times. In the analysis use is made of time steps of a half time unit instead of a whole time unit; this is necessary since the actual rate on S2 is on the outside equal to the normal clock, but inside the circuit the steps happen also halfway, when the switches are operated.

In a first situation, where all the switches are open, with S1 and S2 being open simultaneously for a very short time, at time t:

$$V_{C1}(t)=V_{C2}(t),=>0=V_{C1}(t)-V_{C2}(t)$$

Then the switch S2 and the current source switch close S0 leaving only S1 open.

The current source is not active during the whole period, but only part of it. This is of course the implicit operation of the leading phase detector, and is part of the size of the input signal. The ratio of the time that the signal is active and the supposed sample time is indicated by $\alpha$. The current should stop before the next sample period (S1 closed) starts. In fact, if $\alpha$ stays on longer than the closing of S1, the analysis remains valid and correct. However, the closing of S1 and the activity of the current source is best if kept separate. This is due to impedance dependent current and alike, so second order errors of the physical circuit.

The following equations follow at time $t+\frac{1}{2}T$;

$$V_{C1}(t+\tfrac{1}{2}T)*C1=V_{C1}(t)*C1+\alpha I(t),=>\alpha I(t)=V_{C1}(t+\tfrac{1}{2}T)*C1-V_{C1}(t)*C1$$

(The use of $\alpha I(t)$ indicates that the current is dating from the previous cycle. This is correct in the sense that in a closed PLL loop the VCO responds on a changing control, and thus changes the next cycle of phase detection; thus the current stems from the previous cycle. This also means that the equations do not need an extra Z when closing the loop.)

and $$V_{C3}(t+\tfrac{1}{2}T)*[C2+C3]=V_{C2}(t)*C2+V_{C3}(t)*C3=>0=V_{C3}(t+\tfrac{1}{2}T)*[C2+C3]-V_{C2}(t)*C2-V_{C3}(t)*C3$$

and $$V_{C2}(t+\tfrac{1}{2}T)=V_{C3}(t+\tfrac{1}{2}T),=>0=V_{C2}(t+\tfrac{1}{2}T)-V_{C3}(t+\tfrac{1}{2}T)$$

The situation continues by switch S0 opening, S2 opening and S1 closing.

The following equations apply at time $t+T$ (T=sample period);

$$V_{C1}(t+T)*[C1+C2]=V_{C1}(t+\tfrac{1}{2}T)*C1+V_{C2}(t+\tfrac{1}{2}T)*C2,=>0=-V_{C1}(t+\tfrac{1}{2}T)*C1+V_{C1}(t+T)*[C1+C2]-V_{C2}(t+\tfrac{1}{2}T)*C2$$

and $$V_{C1}(t+T)=V_{C2}(t+T),=>0=V_{C1}(t+T)-V_{C2}(t+T)$$

Finally, opening S2 will not change the voltage on capacitor C3.

$$V_{C3}(t+T)=V_{C3}(t+\tfrac{1}{2}T),=>0=V_{C3}(t+\tfrac{1}{2}T)-V_{C3}(t+T)$$

By seeing this set of equations as a matrix of equations it becomes possible to reduce the complexity (matrix reduction). We have 7 equations, and 3 nodes at 3 times (9 variables), plus a current (so 10 variables total). We can with simple row operations reduce this set of equations to a single equation with only $V_{C3}(t)$, $V_{C3}(t+T)$ and $\alpha I(t)$. This results after a few steps in two equations;

$$\alpha I(t) = V_{C1}(t+T)*[C1+C2] - V_{C1}(t)*C1 - V_{C3}(t+T)*C2$$

and $$V_{C1}(t) = \frac{V_{C3}(t+T)*[C2+C3] - V_{C3}(t)*C3}{C2}$$

These two equations can be rephrased after Z domain transformation;

$$\overline{\alpha I} = \overline{V_{C1}}*Z*[C1+C2] - \overline{V_{C1}}*C1 - \overline{V_{C3}}*Z*C2 = \overline{V_{C1}}*\{Z*[C1+C2] - C1\} - \overline{V_{C3}}*Z*C2$$

and $$\overline{V_{C1}} = \frac{\overline{V_{C3}}*Z*\{C2+C3\} - \overline{V_{C3}}*C3}{C2} = \overline{V_{C3}}*\frac{Z*[C2+C3] - C3}{C2}$$

Substitution of the second equation in the first yields $$\overline{\alpha I} = \overline{V_{C3}}*\frac{Z*[C2+C3] - C3}{C2}*\{Z*[C1+C2] - C1\} - \overline{V_{C3}}*Z*C2$$

$$= \overline{V_{C3}}*\frac{\{Z*[C2+C3] - C3\}*\{Z*[C1+C2] - C1\} - Z*C2^2}{C2}$$

$$\Rightarrow \frac{\overline{V_{C3}}}{\overline{\alpha I}} = transferfunction = \frac{C2}{\{Z*[C2+C3] - C3\}*\{Z*[C1+C2] - C1\} - Z*C2^2}$$

Figure 7:
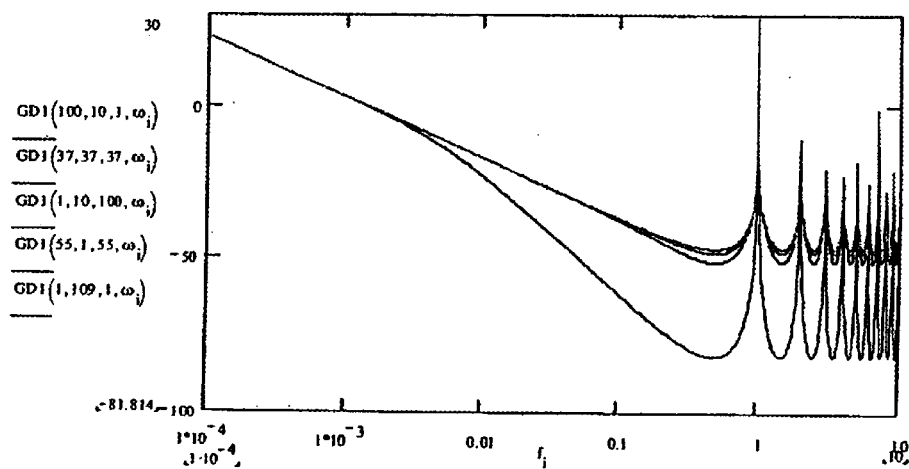
FIG. 7 shows the transfer curve for the filter.

This function can be analysed in more detail. A first method uses simple replacement of Z with its normal meaning; $e^{-pT}$ or $e^{-j\omega T}$, which makes it relatively simple to make a transfer curve, for the magnitude in dB is shown in FIG. 7.

These transfers show the dependency of the transfer as function of frequency (in rad/s in the function call), and as function of the parameters C1, C2 and C3 respectively. The curves show that the choice of a relatively small C2 yields some extra attenuation. This is caused by the 'slow' transport of charge through the middle capacitor C2. It also shows that the summation of the three capacitors determines the low frequency transfer, and acts as a pure integrator (as expected). One trace seems to be missing; GD1(100, 10, 1, ω) happens to precisely coincide with GD1(1, 10, 100, ω). Careful examination of the formula's proofs that this is correct; C1 and C3 can be interchanged without any difference whatsoever. This proves once again that C2 is the capacitor that dominates the transfer function.

Another method of analysis is to investigate the denominator fractions of the transfer function. The transfer function can be rewritten as:

$$transfer = \frac{C2}{C2*(C1+C2+C3) + C1*C3} *$$

$$\frac{1}{(Z-1)*\left(Z - \frac{C1*C3}{C2*(C1+C2+C3) + C1*C3}\right)}$$

The factors can be studied to do some sanity checks; there are two poles; one in Z=1 (DC) which is expected as the normal integrator pole, and a finite pole, which relates to the 'slowness' caused by C2.

By limited substitution of Z by 1 (Z=1 in DC) we can study the DC transfer;

$$\frac{C2}{C2*(C1+C2+C3) + C1*C3} *$$

$$\frac{1}{(Z-1)*\left(1 - \frac{C1*C3}{C2*(C1+C2+C3) + C1*C3}\right)} =$$

$$\frac{1}{Z-1}*\frac{1}{C1+C2+C3} \Rightarrow stepresponse =$$

$$\frac{Z}{Z-1}*\frac{1}{Z-1}*\frac{1}{C1+C2+C3} = \frac{Z}{(Z-1)^2}*\frac{1}{C1+C2+C3}$$

So in DC a step on the input will be a ramp with slope 1/(C1+C2+C3), which was observed before. The same can be done with an impulse and the end value theorem for Z transformation.

Another method of analysis is the use of the bilinear transform in order to describe the curve up to half the sampling frequency in the Laplace domain. For this analysis use of the original bilinear equation is made;

$$s = \frac{2}{T}*\frac{Z-1}{Z+1} \Rightarrow Z = \frac{1 + \frac{T}{2}s}{1 - \frac{T}{2}s}$$

which applies in the region for which it is relatively accurate that x=sin(x)

This model can be used in a substitution to get to a Laplace equation which, after substituting s=jω, and normalising by setting T=1 is;

$$\frac{C2*(j\omega - 2)^2}{2j\omega*\{2*C2*(C1+C2+C3) + j\omega*[C2*(C1+C2+C3) + 2*C1*C3]\}}$$

Figure 8:
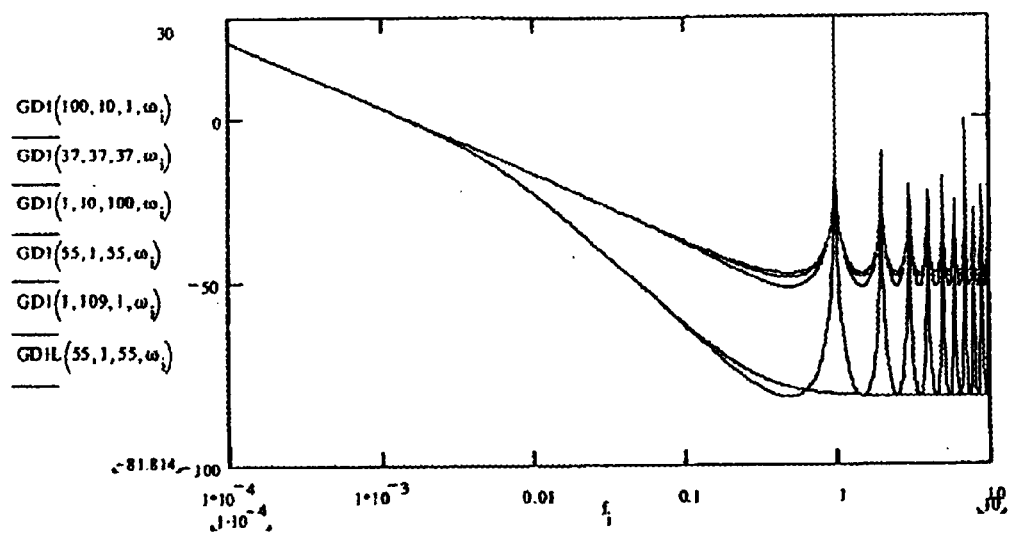
FIG. 8 is a plot of a transfer function for the filter.

This function can be plotted as verification and is shown in FIG. 8.

The extra curve, GD1L, shows the Laplace transfer function, and starts to deviate significantly from the z domain from about 1/10 of the sampling frequency. So the formula is a proper representation for an important part of the frequency spectrum. Most PLL's have their corner frequency for the closed loop somewhere in the part below 1/10 sample frequency. The formula can be used to do more regular stability analysis of the PLL loop. It should be noted that GD1(100, 10, 1, ω) and GD1(1, 10, 100, ω) still overlap, so that only one is visible.

Figure 9:
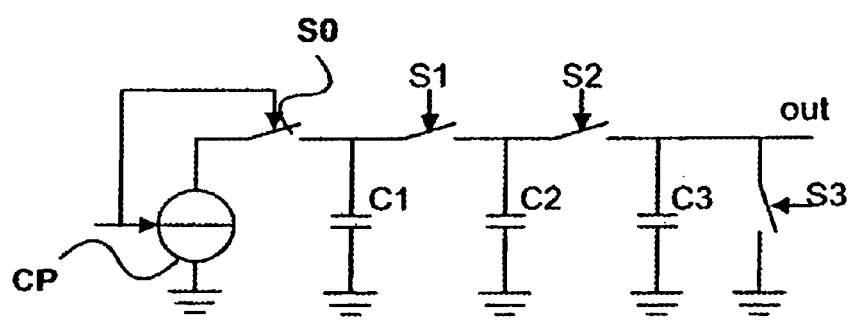
FIG. 9 is a schematic diagram of a second embodiment of a resampler filter.

There is a simple variation on the circuit described above is shown in FIG. 9. This circuit behaves in a radically different manner, especially at low frequencies. Over time all charge will leak away over the last short circuiting switch. Basically C3 now exhibits resistive behaviour. Any input signal will lead the output until the switch S3 on the output resets that output. If the two last switches are switched with a fixed timing, any input signal will lead to some output signal for a fixed amount of time. The switches S2 and S3 are not necessarily switched in complementary fashion. If the charge pumped by the charge pump is large, then so will the output voltage be (over the time it is not reset yet). So the circuit 'behaves' in a linear fashion. The sharing properties of the capacitors are different from the non-resetted version. The resistive nature of the last cap creates this effect.

Figure 10:
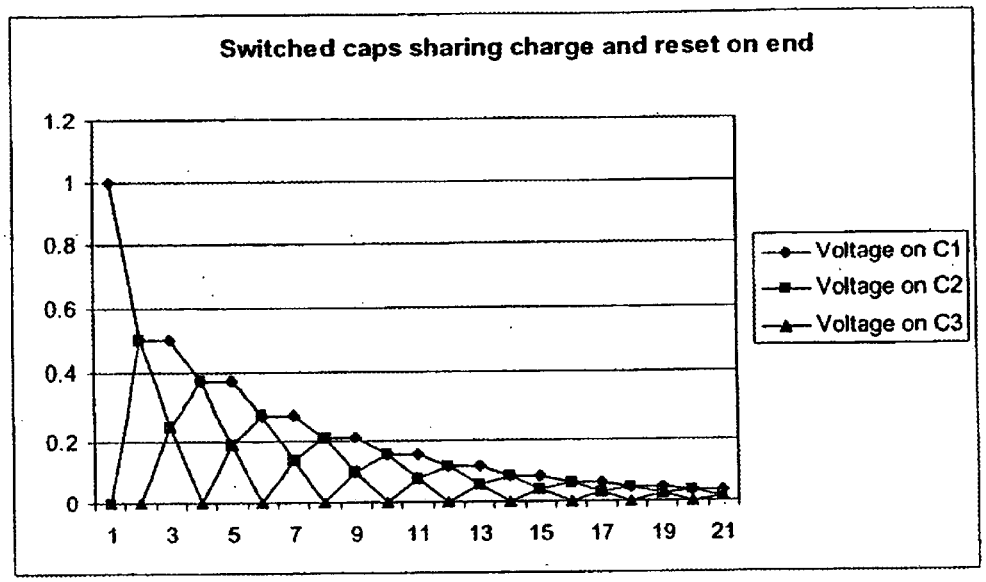
FIGS. 10 to 15 are simulations showing the sharing of charge in switched capacitors for the circuit of FIG. 9.

FIG. 10 shows the result with a scaled impulse into the circuit with three equal sized capacitors, so ratio 1:1:1. It takes quite a bit of time before the end 0 is reached on C3.

Figure 11:
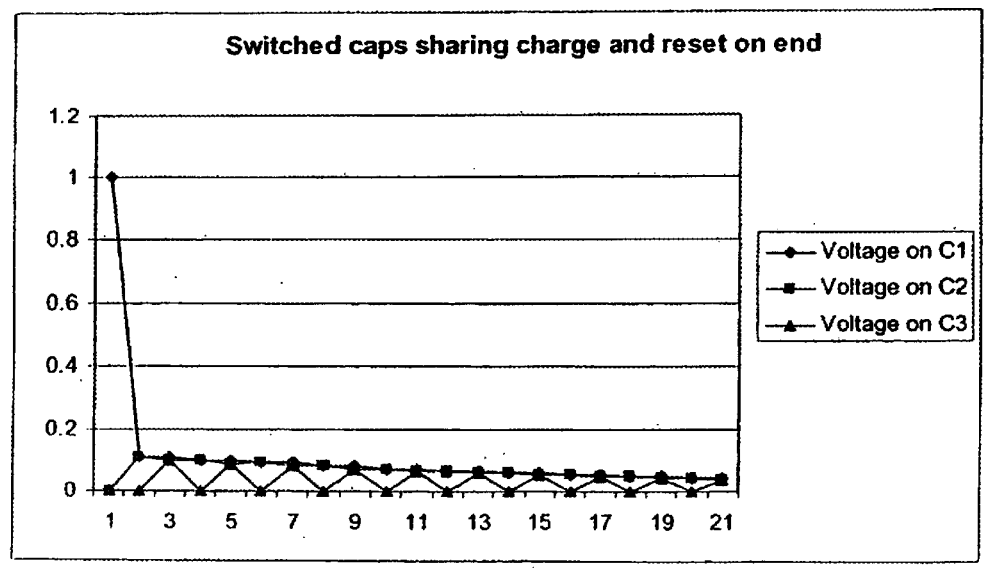

FIG. 11 shows the result of a scaled impulse on capacitors with a ratio 10:80:10. Settling still takes a long time, longer than with 1:1:1.

Figure 12:
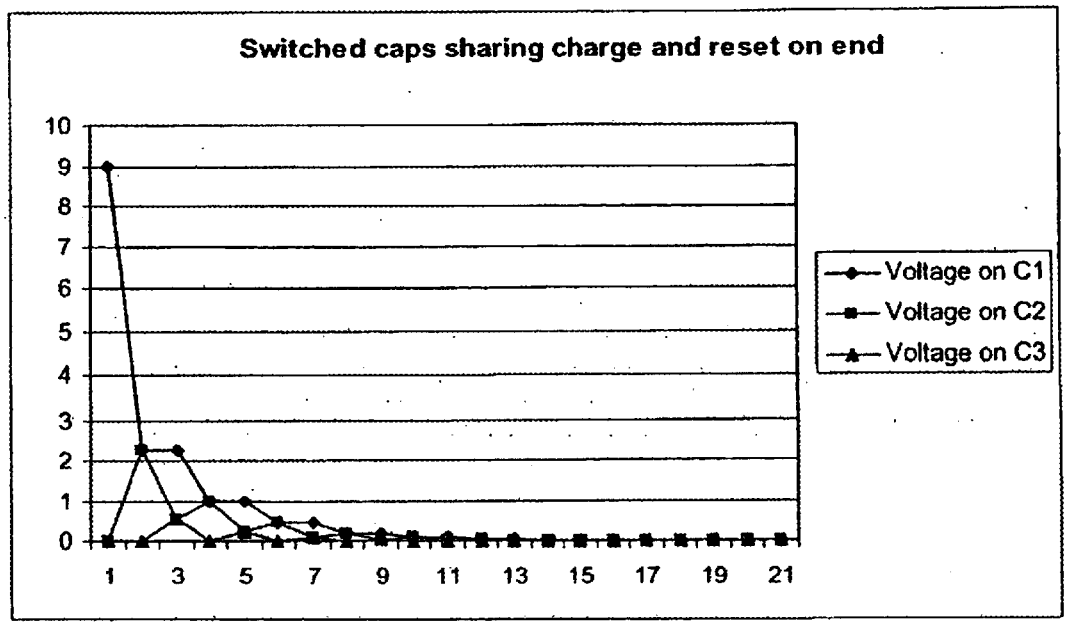

FIG. 12 shows the result with a scaled impulse into the circuit with three capacitors with ratio 1:3:9. Settling now becomes fast and more or less reasonable. To make it quite certain we can also plot the integral of the voltage on CAP3, which should go towards 1.

Figure 13:
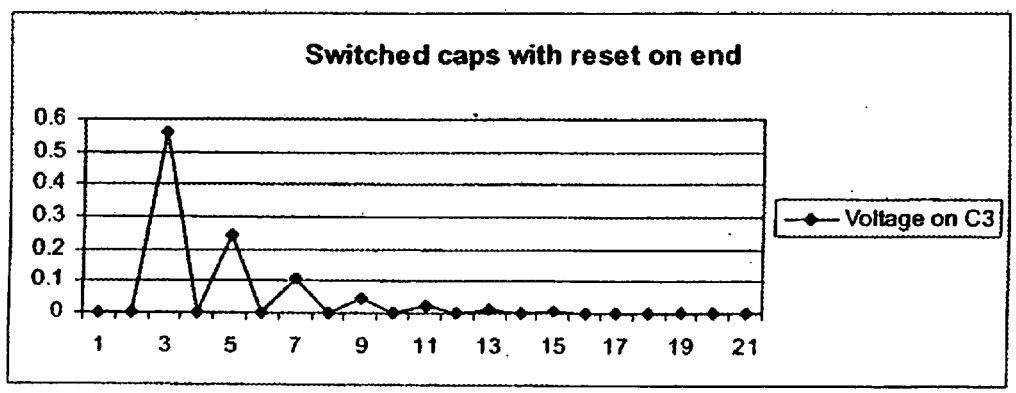

FIG. 13 is an enlargement of the voltage on C3 only, to show the details of the series.

Figure 14:
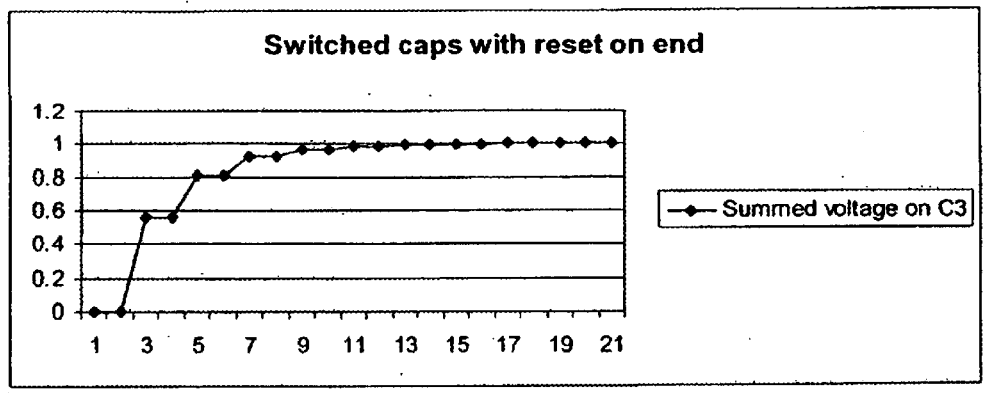

FIG. 14 shows the integrated (summed) voltage on C3 for a same capacitor ratio for C1:C2:C3 of 1:3:9. This graph shows that C3 has contributed its 'resistive' part in a short period of time; the first cycle about 60% is already done, in 3 cycles it reaches more then 90% effective result.

It is clear that the voltage that should be forwarded by this circuit, is not direct as in the resistor solution. Instead it has an extra delay $\tau$ of about 1 sample period (the first step, near to 63%) or 1 reference period. This extra delay is equivalent to a low pass frequency equal to $f=\omega/2\pi=\frac{1}{2}\pi\tau=fref/2\pi$. This can be correlated with the chosen low pass frequency in the loop, so that it is straightforward to create a stable loop. In fact, there is a little extra help in the form of delays also on the non-resistive part; the capacitive part without reset is also not extremely fast. This creates 'slack' for the resistive path to do its stabilising work. With for instance Excel it turns out to be simple enough to find the limits of stability and the like.

By slightly exaggerating the ratios we can show the comparison between the original resistor and the new circuit.

Figure 15:
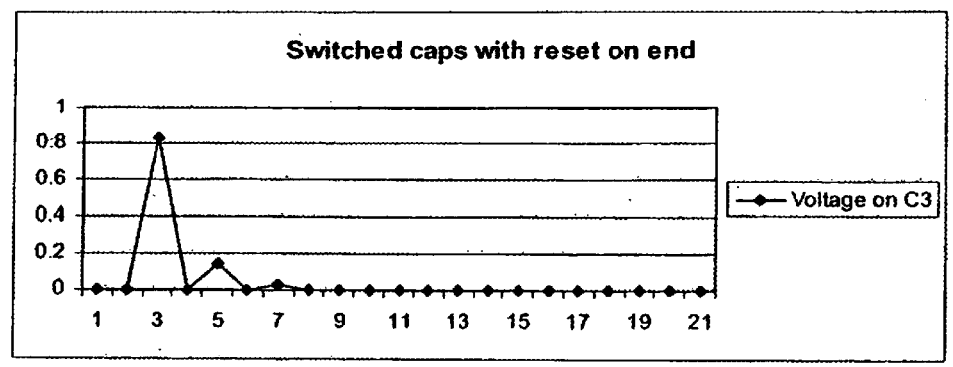

FIG. 15 shows the voltage on C3 with a ratio for C1:C2:C3 of 1:10:100. This is slightly exaggerated, but yields clearly a signal alike the resistor in the normal RC loop filter; an almost single pulse. Thus this circuit is a reasonable alternative for the true resistor using capacitors and switches only, which have low noise, implicit stability (depending on C1, C2, C3) and implicit retiming.

The resistor carries the charge current (fixed) over its resistance (fixed) for some amount of time (variable). As stated before, the relevant representation is the integral. The capacitor circuit carries a value which is on the first capacitor already the integrated version of charge current and time. The actual size of the signal depends on the capacitor value. The output carries this integrated value during a fixed time on its output, after which it is reset.

The difference between capacitor and resistor approach is that the capacitor approach can be timed in any way. Therefore the signal from the 'resistive' part formed by the capacitors is in fact stretchable up to almost a full cycle. This could for instance be done by having S3 short circuit during a few ps (if feasible), just before S2 closes again. Of course this would be hampered by practical considerations, but an effective contribution of for instance 15/16 cycle is no problem. In an example; suppose that the feedback frequency would be equal to 100 kHz (10 µs cycle) and the phase error would be equal in time to 1 ns. Finally suppose that the current would be 100 µA into the traditional resistor of 1 kOhms. Then a voltage peak of 100 µA*1 kOhms=0.1V during 1 ns would result with resistors. With the switched cap implementation the voltage would instead be for instance 16/15*0.1V*1 ns/10 µs=10.7 µV during 15/16*10 µs=9.4 µs. In other words; the same contribution but much more evenly spread. With an extra sample cap the 15/16 ratio could even be made 1/1, but would yield an extra factor to design, which probably is not worthwhile.

This means that the real resistor must contribute its stabilizing contribution to the VCO control voltage in a much shorter timespan than the capacitive solution. This influences the output spectrum of the PLL in a negative way. The capacitor solution is superior to the resistor solution.

There is another substantial difference between the reset and the non-reset switched capacitor circuit. The non-reset version has a total 'capacitive' value that is equal to the sum of C1 and C2 and C3. However, the rest version has a 'resistive' value that is depending only on C3. This is true because C3 is the only leak in the system; all charge must go 'through' this switched cap.

Figure 16:
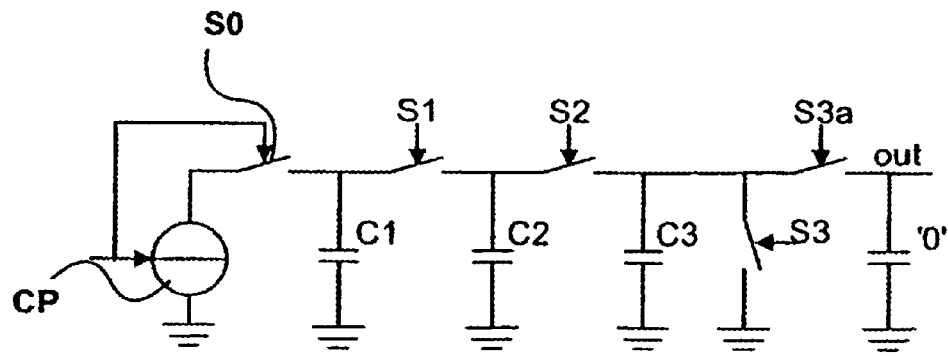
FIG. 16 is a schematic diagram of a resampler filter circuit useful in the analysis of the circuit shown in FIG. 9.

Like the perfect integrator, the leaky integrator can be analysed in the frequency domain. Again a number of equations can be developed. The voltage on C3 is a awkward for formulae since it is reset during part of each sampling period. For analysis purposes only a sample and hold stage (with an infinitesimal capacitor for memory) is added as shown in FIG. 16, so that the sample on the output is active for a complete cycle. The fact that the output is not a whole cycle active, but only a part (which we will call $\beta$), is a simple weighing factor that is easy enough to balance out in the formulas. For instance if the reset is active half the time, an extra weighing factor of ½ is needed. Of course the precise spectral behaviour is also changed, but only for high frequencies, which are hardly relevant for the analysis.

Just before starting we have all switches open but we have left from the position in which S1 was closed (connecting C1 and C2) and S3 was closed (shorting C3). So at time t the following equations are correct;

$$V_{C1}(t)=V_{C2}(t), =>0=V_{C1}(t)-V_{C2}(t)$$

and $$V_{C3}(t)=0$$

Figure 17:
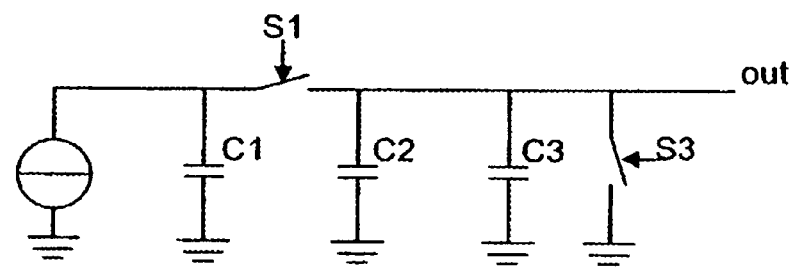
FIG. 17 shows a configuration of the circuit shown in FIG. 16.

Then the switch S2 and the current switch close. The situation shown in FIG. 17 arises.

Again the current source is not active during the whole period, but only part of that. This is again the implicit operation of the leading phase detector, and is part of the size of the input signal. The ratio of the time that the signal is active and the supposed sample time is indicated with $\alpha$.

The following equations follow at time t+½T;

$$V_{C1}(t+\tfrac{1}{2}T)*C1=V_{C1}(t)*C1+\alpha I(t), =>\alpha I(t)=V_{C1}(t+\tfrac{1}{2}T)*C1-V_{C1}(t)*C1$$

(It should be noted that in the frequency analysis of the first capacitor circuit still holds; the current is the result of the changed VCO voltage in the previous cycle, so that an extra delay is present in the resulting equations).

and $$V_{C3}(t+\tfrac{1}{2}T)*[C2+C3]=V_{C2}(t)*C2+V_{C3}(t)*C3=V_{C2}(t)*C2, =>0=V_{C3}(t+\tfrac{1}{2}T)*[C2+C3]-V_{C2}(t)*C2$$

and $$V_{C2}(t+\tfrac{1}{2}T)=V_{C3}(t+\tfrac{1}{2}T), =>0=V_{C2}(t+\tfrac{1}{2}T)-V_{C3}(t+\tfrac{1}{2}T)$$

and $$V_{out}(t+\tfrac{1}{2}T)=V_{C3}(t+\tfrac{1}{2}T), =>0=V_{out}(t+\tfrac{1}{2}T)-V_{C3}(t+\tfrac{1}{2}T)$$

Figure 18:
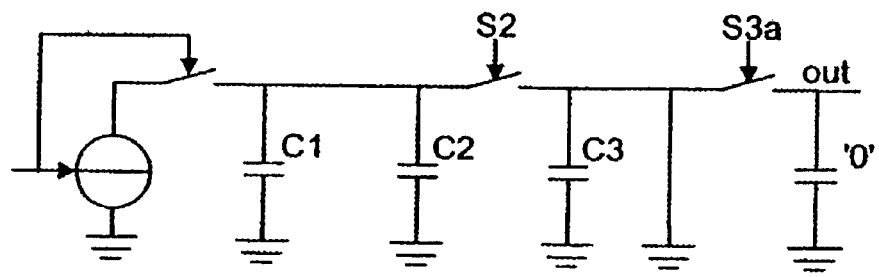
FIG. 18 shows a second configuration of the circuit shown in FIG. 16.

Then switches S2 and S3a are opened and switches S1 and S3 are closed. The situation shown in FIG. 18 and relationships arise at time t+T (with T=sample period);

$$V_{C2}(t+T)*[C1+C2]=V_{C1}(t+\tfrac{1}{2}T)*C1+V_{C2}(t+\tfrac{1}{2}T)*C2 \Rightarrow 0=V_{C1}(t+\tfrac{1}{2}T)*C1-V_{C2}(t+T)*[C1+C2]+V_{C2}(t+\tfrac{1}{2}T)*C2$$

and $$V_{C2}(t+T)=V_{C1}(t+T) \Rightarrow 0 = V_{C1}(t+T) - V_{C2}(t+T)$$

and $$V_{C3}(t+T)=0$$

and $$V_{out}(t+T)=V_{out}(t+\tfrac{1}{2}T), \Rightarrow 0 = V_{out}(t+\tfrac{1}{2}T) - V_{out}(t+T)$$

The formulae can again be used for matrix reduction, more or less along the same lines. The final results become;

$$\alpha I(t) = V_{C1}(t+T)*[C1+C2] - V_{C1}(t)*C1 - V_{out}(t+T)*C2$$

and $$V_{C1}(t) = \frac{V_{out}(t+T)*[C2+C3]}{C2}$$

These two equations can be rephrased after Z domain transformation;

$$\overline{\alpha I} = \overline{V_{C1}}*Z*[C1+C2] - \overline{V_{C1}}*C1 - \overline{V_{out}}*Z*C2$$
$$\Rightarrow \overline{\alpha I} = \overline{V_{C1}}*\{Z*[C1+C2]-C1\} - \overline{V_{out}}*Z*C2$$

and $$\overline{V_{C1}} = \frac{\overline{V_{out}}*Z*[C2+C3]}{C2} = \overline{V_{out}}*\frac{Z*[C2+C3]}{C2}$$

Substitution of the second equation in the first yields $$\overline{\alpha I} = \overline{V_{out}}*\frac{Z*[C2+C3]}{C2}*\{Z*[C1+C2]-C1\} - \overline{V_{out}}*Z*C2$$
$$= \overline{V_{out}}*\frac{Z*[C2+C3]*\{Z*[C1+C2]-C1\}-Z*C2^2}{C2}$$
$$\Rightarrow \frac{\overline{V_{out}}}{\overline{\alpha I}} = transferfunction = \frac{C2}{Z*[C2+C3]*\{Z*[C1+C2]-C1\}-Z*C2^2}$$
$$\Rightarrow transferfunction = \frac{1}{Z}*\frac{C2}{Z*[C2+C3]*[C1+C2]-C2^2-C1*[C2+C3]}$$

Reintroduction of the behaviour of the duration of the non-short circuited C3 (relative weighing factor β) yields a slightly different formula;

$$transferfunction = \frac{\beta}{Z}*\frac{C2}{Z*[C2+C3]*[C1+C2]-C2^2-C1*[C2+C3]}$$

Figure 19:
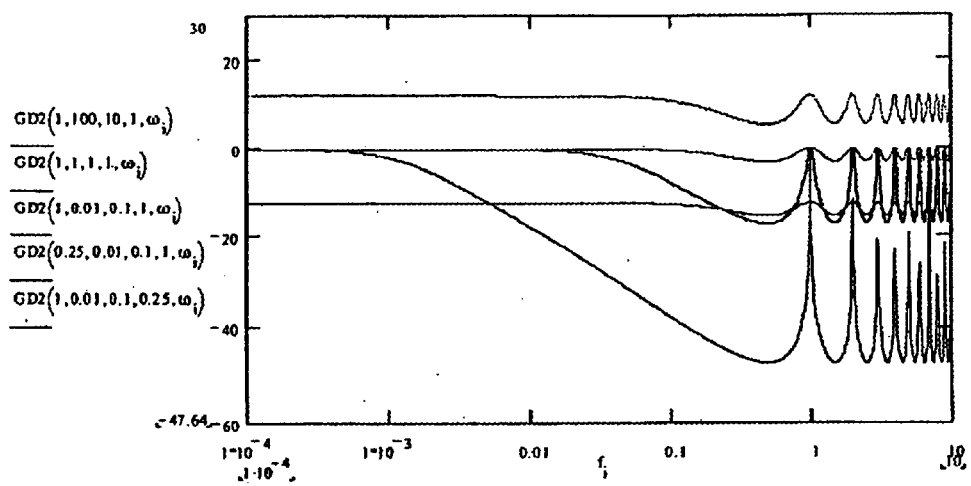
FIG. 19 shows the behaviour of the circuit of FIG. 16.
Figure 20:
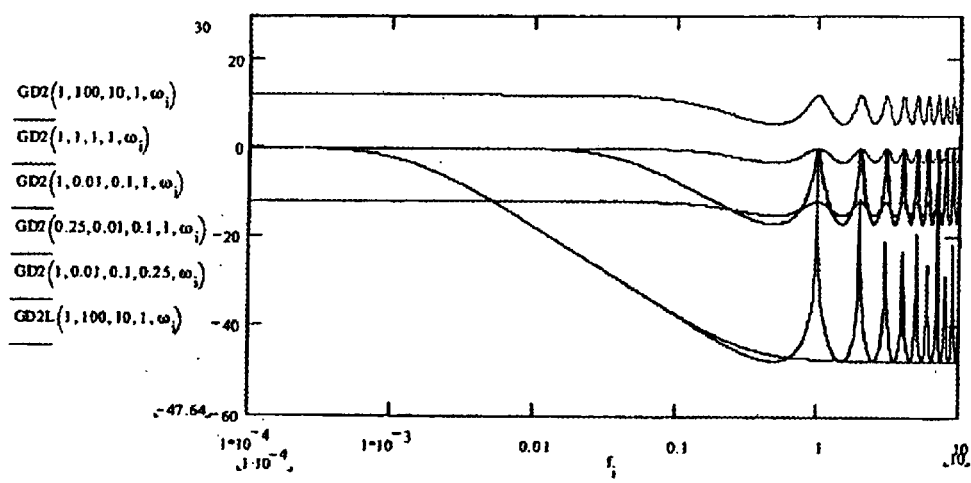
FIG. 20 shows the Laplace transform of the circuit of FIG. 16.

This formula can again be used for some simple analyses. First we plot a few transfer curves using simple replacement of Z with its normal meaning; $e^{-pT}$ or $e^{-jwT}$. In the transfers the time T is chosen normalized on 1. The variables in the function calls are respectively β, C1, C2, C3 and ω (rad/s). The curve shown in FIG. 19 is the transfer magnitude in dB's.

The last trace (top trace on plot) shows that the end capacitor, C3, determines the actual transfer behaviour in DC. This is not surprising as the C3 capacitor is the only capacitor that is actually switched as a resistor type switched capacitor. The $4^{th}$. trace (lowest trace in DC) shows the influence of the factor β, which in this case reduces the relative sensitivity with a factor 4 (12 dB). The other curves show that the resistive behaviour is best approximated if C1<<C2<<C3. Vice versa, if this is not the case, the transfer will have a relatively strong delaying effect, which shows itself by the sloping part of the curves. In short; the transfer to the last cap should be as fast as possible.

Again, as an extra, the bilinear transform can be used to give a Laplace formula, which is more readily integrated in a normal closed loop analysis for the PLL;

$$Z = \frac{1+\frac{T}{2}s}{1-\frac{T}{2}s}$$

which applies in the region for which it is relatively accurate that x=sin(x). After substituting s=jω and normalizing by setting T=1, the transfer function becomes;

$$\frac{\beta*C2*(j\omega-2)^2}{(2+j\omega)*\{2*C2*C3+j\omega*[2*C2*(C1+C2+C3)+2*C1*C3-C2*C3]\}}$$

which can again be plotted by adding a single line, GD2L (GD2Laplace);

The bottom curve is referred to as the Laplace curve (GD2L), but the Laplace line starts to diverge around the $\frac{1}{10}$ of the sample frequency. So the match between original Z and related Laplace formula is again quite good. Again, using the Laplace formula is slightly simpler for the loop analysis, as that typically will be done in the Laplace domain.

The new circuits can be effectively used to design a simplified version.

For a 'normal' PLL resampling is attractive. It can reduce ripple due to the type of phase detector, or ripple due to a phase offset. The choice of the phase detector is typically coupled to the use of the PLL. The choice of phase offset is more coupled to inherent linearity problems in the detector around the 0 crossing. And there are of course systems where the offset is created because of the chosen technology.

Figure 21:
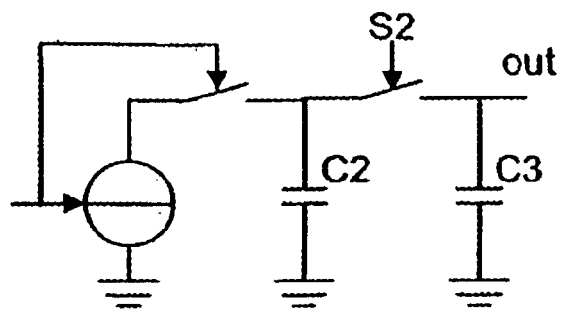
FIGS. 21 and 22 show alternative configurations of resampler filter.

FIG. 21 shows the simple resampled version of the normal capacitor in the filter. It will reach its end value directly when the sample switch is closed, and the effective capacitance (for the filter sensitivity) will be the sum of C2 and C3.

Figure 22:
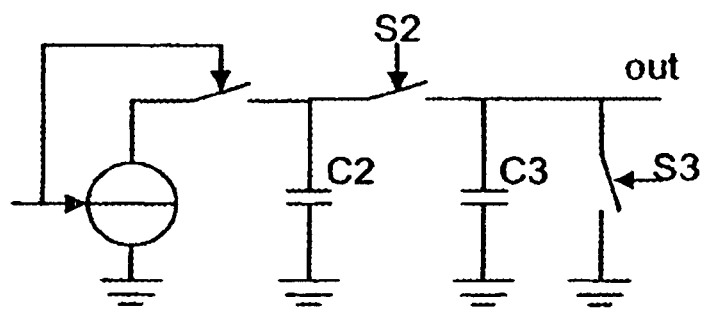

FIG. 22 is the simple resampled version of the normal resistor in the filter. The way it reaches its end value depends again on capacitor ratios, but in this case only the ration C2:C3 plays a role. For instance will the ratio 1:10 yield 90% effectiveness in a single sample cycle.

Figure 23:
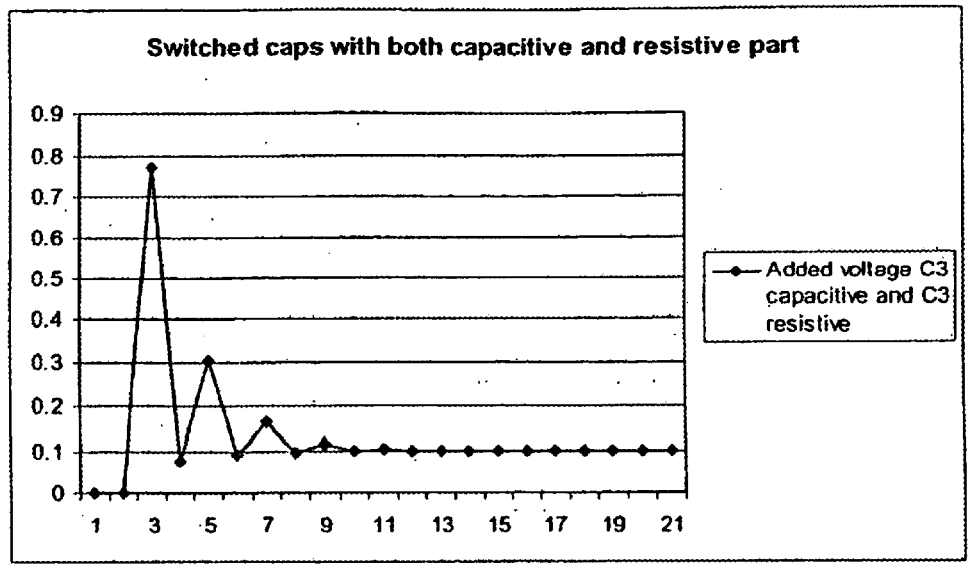
FIG. 23 is a plot showing the effect of stacking the novel circuits.

In the traditional approach the two parts (integrating and proportional) are stacked by a series connection of capacitor and resistor. In fact it can be shown that the new circuits can be just as easily stacked. The stacking is a simple format of an adder function. This is possible because the charge pump has a current output; the actual voltage is of minor importance, and stacking is acceptable. FIG. 23 shows a straightforward simulation of the total of a resistive and a capacitive part by just adding the two. The integrating part is taken on with a smaller weighting than the proportional part, as may be expected in real life (this is due to stability considerations)

The figure shows the total voltage if the integrating capacitors have a ratio of 1:1:1, and the resistive capacitors have a ratio 1:5:25. The actual total weight of the resistive part is 10 times larger than the capacitive part. It will be clear that the addition yields a waveform that in many aspects has connections with the waveforms from the resistor/capacitor combination. A detail for instance is that the slowness of the capacitive part creates space to allow for some slowness on the resistive part.

Figure 24:
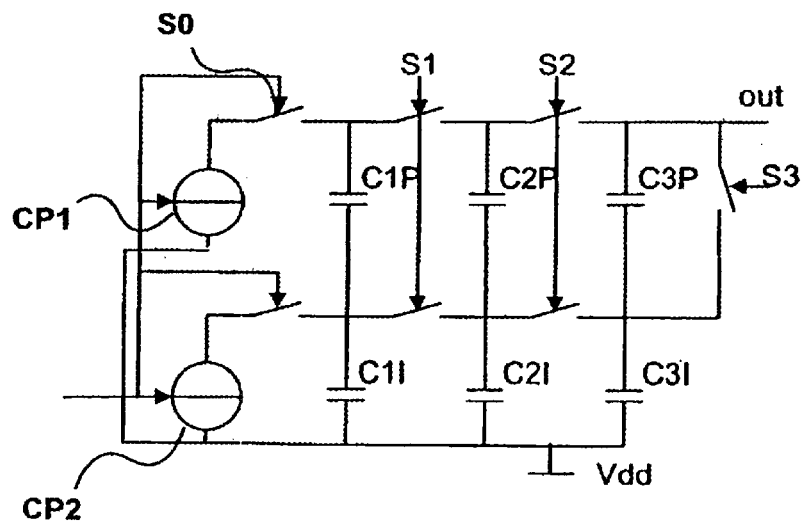
FIG. 24 is a schematic diagram of a SONET PLL.

The actual addition can be done in many ways. For the SONET PLL a total schematic is a shown in FIG. 24. This circuit uses two current sources. It gives separate control over the proportional part and the integral part without using extremely large capacitors. It provides coupling against Vdd because the VCO is controlled against Vdd. This is typically related to the process in which the design is made. The integral part is closest to Vdd. Parasitic effects make it difficult to have the integral part swing up and down with the proportional part. It uses a single control voltage for the VCO.

Figure 25:
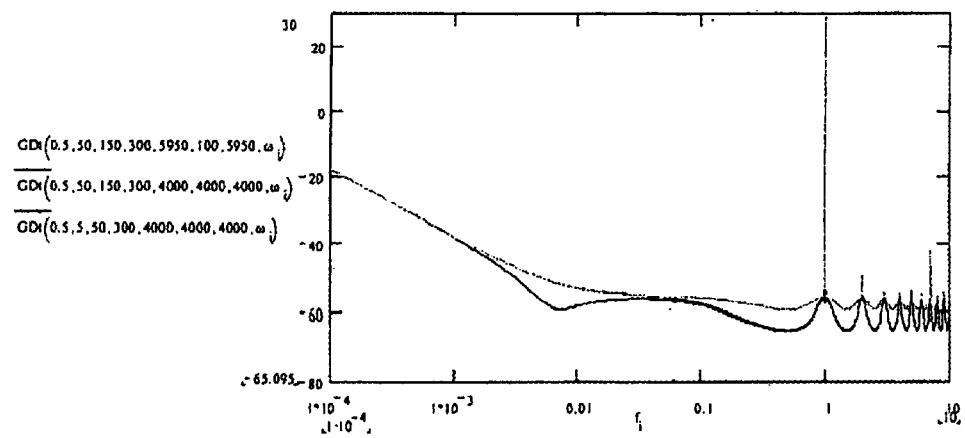
FIGS. 25 and 26 are curves showing the behavior of the combined circuit.
Figure 26:
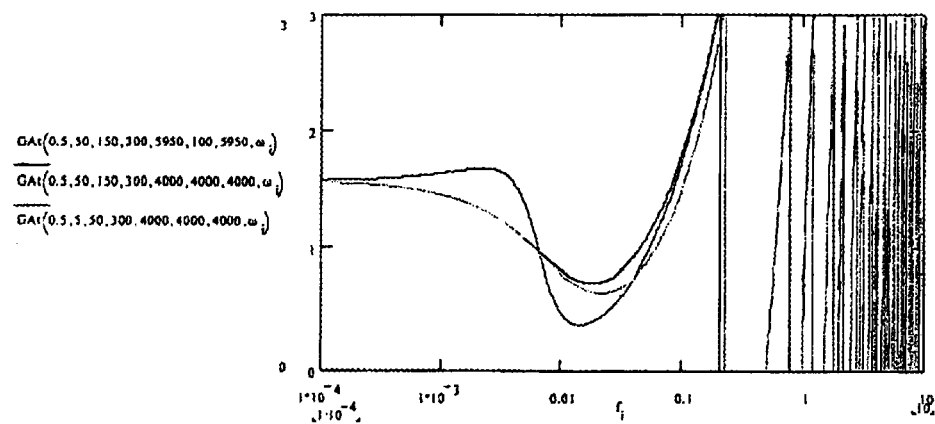

The combined circuit can be analyzed by using the summation of the earlier functions. The actual analysis yields quite complex functions as shown in FIGS. 25 and 26.

The curves are called with a fixed weighing factor $\beta=0.5$ for the non-short circuit duration on the proportional part, and 'proportional' capacitors CP1, CP2, CP3, and 'integrating' capacitors CI1, CI2, CI3, all for the same current I, of course for varying frequency;

The argument of the transfer function (phase) is also of interest closing the loop in the PLL will make the actual argument a major design criterion (because of phase margin and gain margin).

These phase curves are called with the same parameters as the magnitude of the transfer function.

From looking at these curves it will be seen that varying CI2 (the middle capacitor in integrating part) yields a useful extra attenuation. For extra suppression, for instance of the reference, or shaping elements in a jittershaped loop, this can be quite attractive. Changing the ratios in the proportional part may have some influence on the decision for gain margin; the less extreme ratio is not so well defined as proportional, and thus has more attenuation (between $\frac{1}{10}$ sample frequency and higher), while the phase is hardly changed. This may be advantageous for stability. In order to obtain decent loop stability, the phase margins must be acceptable this means that the integrating part must be small when compared to the proportional part. The sizes to be compared are the surfaces under the curves in a single acquisition cycle, for those area's represent the phase change. For the normal resistor/capacitor combination the first time/voltage figure is a handy representation and calculation tool, for the capacitive approach something alike applies. In the drawn curves this effect is taken along. The ratio between the capacitors in the proportional part and integrating part may be relatively fixed. If the sampling frequency changes, the transfer behaviour of the filter does not change. Therefore, if the feedback frequency in the loop changes, the filter does not need changing. For an RC filter this is very much not the same; with a twice as high reference/feedback frequency, the R must halve to have the filter behave the same (Or C must double, the precise decision also depends on possible changes of the sensitivity of the VCO).

The combination circuit has good properties that allow variation in the gain and phase margins. In most applications this is an important design flexibility.

It should be remembered that for closing the loop, the equations of the proportional and integrating part of the control already have taken care of the sampling done by the phase detector. Thus the formulae need to be augmented only with the transfer of the VCO (typically something like $K_v/s$) and the phase detector (typically some number $K_p$) to yield the complete equation for frequency analysis. Of course, if there are extra delays (such as in a SONET application, which delays an extra ½ cycle for allowing shaping of the phase detector) they should be taken along as a separate issue in the closing of the loop. In the case that the desired loop bandwidth increases close to the sample rate, the approximation of the Z curves with the bilinear substituted version in the Laplace domain would not be valid anymore. At that moment the modified Z transform should be used.

The circuit can be used in any loop. The simplified version of the circuit as presented in an earlier paragraph has somewhat less possibilities than the complex circuit. But even then it can provide better spectral performance of the VCO (when compared to the normal resistive solution), since the contribution of the resistive part is spread over a longer period. Also the noise is just with capacitors than with resistors. There is one exception to this; the switches will introduce some switching noise, although in reality this is less than would seem to be the case.

Figure 27:
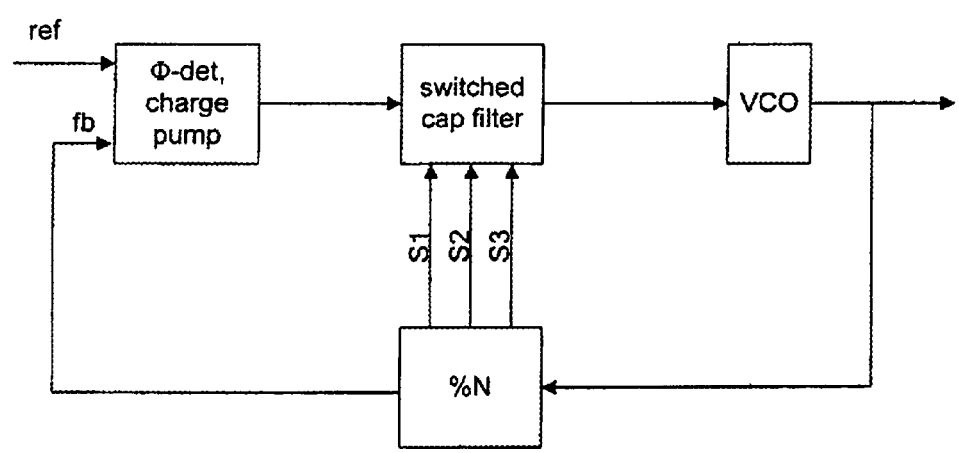
FIG. 27 shows a first implementation of the novel circuits in a PLL.

FIG. 27 shows how the novel circuits should be used in a PLL implementation. A conventional RC filter is effectively driven once per feedback cycle, for that cycle dictates together with the reference input the active moments of the phase detector. Thus, if the switched capacitor filters are operated at the rate of the feedback, there is not much change again compared to the normal RC filter. The actual driving signals can then most conveniently be derived from the divider that divides the VCO frequency down to the feedback frequency. This circuit behaves in a way that is not really much different from the normal situation, except that the divider must have some extra signals on the output. For fixed dividers these signals may for instance be identical to normal divider bits.

The novel approach to PLL resampling filters has several advantages over the prior art. There are more freedoms of design. The time over which the 'proportional part' is presented to the VCO can be chosen. The currents from the charge pump and the capacitors can be chosen relatively independently. The two branches have implicit excellent matching which can be made part of the design considerations. The two branches being fixed, behave relatively independent of the actual sample frequency; another feedback frequency does not drastically change the transfer, as it is the case with the RC filter. The method is just as well suited for double current sources as single, for a double input VCO or a single input VCO, so suited for any environment. Of course the circuits must be adapted accordingly.

In technological terms because the circuit only includes capacitors and no resistors, noise can be less of a consideration, especially in the case of relatively low pass frequencies (such as 5 kHz–50 kHz). The resampling solves the problem of ripple in any phase detector. Thus it becomes much easier to have no ripple problem in the case of EXOR detectors, RS detectors with leakage or phase offset. Allowing phase offsets is in general better for performance of PLLs; with offset it becomes possible to avoid the 'tricky' transition area from positive charge current from the charge pump to the negative area. Since there are always matching problems in this area minor chaotic effects can appear. Staying away from that area is in that sense positive.

It will be apparent to one skilled in the art that many additional variations of the invention are possible without departing from the scope of the appended claims.

What is claimed is:

1. A phase locked loop comprising:
   a phase detector having an output;
   a voltage controlled oscillator having an input;
   a feedback loop connecting an output of said controlled oscillator to an input of said phase detector; and
   a resampling filter connecting the output of said phase detector to the input of said controlled oscillator; and
   said resampling filter comprising:
   a charge pump;
   a plurality of switched capacitors arranged in a parallel arrangement between ground and line;
   a first switch in said common line for switchably connecting said charge pump to a first of said capacitors; and
   further switches in said common line between adjacent pairs of said capacitors; and
   wherein said first switch and said further switches are controlled by signals derived from the voltage controlled oscillator so as to successively distribute charge over said switched capacitors.

2. A phase locked loop as claimed in claim 1, wherein said feedback loop includes a proportional circuit controlling the switching of said switched capacitors.

3. A phase locked loop as claimed in claim 2, comprising three said switched capacitors in parallel.

4. A phase locked loop as claimed in claim 3, wherein a switch for a first of said capacitors forms part of said charge pump.

5. A phase locked loop as claimed in claim 3, wherein said capacitors all have the same capacitance.

6. A phase locked loop as claimed in claim 3, wherein said three switched capacitors comprise tow outer capacitors and a central, and said central capacitor has a capacitance substantially greater than the other capacitors.

7. A phase locked loop as claimed in claim 6, wherein the ratio of capacitance of said capacitors is about 1:8:1.

8. A phase locked loop as claimed in claim 3, wherein said three switched capacitors comprise two outer capacitors and a central capacitor, and said outer capacitors have a relatively large capacitance compared to the central capacitor.

9. A phase locked loop as claimer in claim 1, further comprising a switch in parallel with one of said capacitors to provide a leaky capacitor circuit.

10. A phase locked loop as claimed in claim 9, comprising three said switched capacitors in parallel.

11. A phase locked loop as claimed in claim 10, wherein said switch capacitors all have the same capacitance.

12. A phase locked loop as claimed in claim 11, wherein said three switched capacitors comprise two outer capacitors and a central capacitor, and said central capacitor has a capacitance substantially greater than the other outer capacitors.

13. A phase locked loop as claimed in claim 11, wherein the ratio of capacitance of said capacitors is about 1:8:1.

14. A phase locked loop as claimed in claim 12, wherein the outer capacitors have a relatively large capacitance compared to the central capacitor.

15. A phase locked loop as claimed in claim 1, comprising a second charge pump associated with a plurality of switched capacitors arranged in parallel with said first charge pump and said plurality of switched capacitors associated with said first charge pump.

16. A phase locked loop as claimed in claim 15, wherein said switched capacitors associated with said respective charge pumps are arranged in series pairs, one capacitor of each series pair being associated with a respective one of said charge pumps.

* * * * *